United States Patent [19]

Sanemitsu

[11] Patent Number: 5,138,142
[45] Date of Patent: Aug. 11, 1992

[54] IC CARD WITH IMPROVED POWER SUPPLY SWITCHING CIRCUITRY

[75] Inventor: Yoshikado Sanemitsu, Itami, Japan

[73] Assignee: Mitsubishi Denki Kabushiki Kaisha, Japan

[21] Appl. No.: 647,477

[22] Filed: Nov. 29, 1990

[30] Foreign Application Priority Data

Jun. 19, 1990 [JP] Japan .................................. 2-160604

[51] Int. Cl.⁵ .............................................. G06K 19/06
[52] U.S. Cl. ...................................... 235/492; 307/25; 307/30; 307/66
[58] Field of Search .................... 235/492; 307/25, 30, 307/66

[56] References Cited

U.S. PATENT DOCUMENTS

| | | | |
|---|---|---|---|
| 3,949,238 | 4/1976 | Brookes | 307/23 X |
| 4,001,550 | 1/1977 | Schatz | 235/492 X |
| 4,658,151 | 4/1987 | Wyser et al. | 307/66 |
| 4,659,942 | 4/1987 | Volp | 307/19 |
| 4,670,661 | 6/1987 | Ishikawa | 307/66 |
| 4,810,864 | 3/1989 | Takahashi | 235/487 |
| 5,047,988 | 9/1991 | Mizuta | 235/492 X |

FOREIGN PATENT DOCUMENTS 0152802  1/1985  European Pat. Off. .

OTHER PUBLICATIONS

Muller et al., "Lithium-Power-Module: Speicherinhalte am Leben erhalten", Elektronik, vol. 35, No. 9, May 1986, pp. 66-72, translation supplied.

*Primary Examiner*—David Trafton
*Attorney, Agent, or Firm*—Leydig, Voit & Mayer

[57] ABSTRACT

An IC card has its internal load divided into a plurality of load circuits through which substantially equal currents flow. A power supply switching circuit is provided for each of the load circuits. The switching circuits switch the power supply for the IC card between an internal power supply and an external power supply to avoid excessive voltage losses when the current for the internal load flows through a single switching circuit.

5 Claims, 3 Drawing Sheets

IC CARD WITH IMPROVED POWER SUPPLY SWITCHING CIRCUITRY

The present invention relates to an IC card having an internal power supply and more particularly to such an IC card including improved power supply switching circuitry which switches an operating power source for the IC card between the internal power supply and an external power supply.

BACKGROUND OF THE INVENTION

An example of conventional IC card including a power supply switching circuit is shown in FIG. 1. In FIG. 1, an IC card 10 includes therein semiconductor devices 1 and 2, such as IC devices, including memories and microcomputers, an internal power supply 3, and a power supply switching circuit 4 which will be described later. The IC card 10 includes a connector 6 for connecting the IC card to an external device (not shown). The connector 6 is connected to an external-power-supply line 7 through which external power is supplied to the IC card, a common ground line 8, an address line 9 connected in common to the semiconductor devices 1 and 2, a control line 11 also connected in common to the semiconductor devices 1 and 2, a data line 12 for transferring data between memories within the semiconductor device 1 and the external device, and a data line 13 for transferring data between memories within the semiconductor device 2 and the external device, which are all within the IC card 10.

The external-power-supply line 7 is connected to the anode of a first diode 14 which acts as a switching element of the power supply switching circuit 4. The internal power supply 3 is connected via a resistor 15 to the anode of a second diode 16 which also acts as a switching element of the power supply switching circuit 4. The cathodes of the diodes 14 and 16 are connected to a common power supply line 18 for coupling operating voltages to the semiconductor devices 1 and 2. The control line 11 is connected via a pull-up resistor 19 to the commonly connected cathodes of the diodes 14 and 16 of the power supply switching circuit 4. The commonly connected cathodes of the diodes 14 and 16 receive a voltage $V_{cc}$.

When the connector 6 is not connected to the external device, the IC card 10 is operated from a voltage supplied by the internal power supply 3 of, for example, 3 V. Specifically, when the connector 6 is not connected to the external device, the diode 16 is conductive so that an operating voltage is supplied to the semiconductor devices 1 and 2 from the internal power supply 3 via the resistor 15, the conducting diode 16 and the power supply line 18. Thus, the IC card 10 is placed in a stand-by mode.

In contrast, when the connector 6 is connected to the external device, an external voltage of, for example, 5 V is applied from an external power supply through the connector 6 to the external-power-supply line 7. This turns the diodes 14 and 16 in the power supply switching circuit 4 on and off, respectively, so that an operating voltage is supplied from the external-power-supply line 7 to the semiconductor devices 1 and 2 via the diode 14 and the power supply line 18 to condition the memories in the semiconductor devices 1 and 2 for normal operation. When an address signal is applied to the address line 9 and the control line 11 is made active, data can be written into or read from the memories through the data lines 12 and 13.

Current flowing when the above-described conventional IC card operates from the internal power supply 3, i.e. standby current $I_s$, is several microamperes, and, therefore, as is understood from the diode V-I characteristic curve of FIG. 2, a voltage drop $V_s$ across the diode 16 of the power supply switching circuit 4 is very small and, accordingly, has no adverse influence on the operation of the IC card. In contrast, when the IC card 10 is operated from the external power supply, current flowing through each of the semiconductor devices 1 and 2 is 50–100 mA, which is significantly larger than the standby current. As shown in FIG. 2, a voltage drop $V_2$ across the diode 14 when current 2I for operating the semiconductor devices 1 and 2 flows is, for example, 0.7 V or so, and, therefore, operating voltages applied to the respective semiconductor devices 1 and 2 decrease. This voltage decrease causes degradation of operational characteristics of the semiconductor devices 1 and 2. For instance, the time required for accessing the memories may become longer, proper timing for writing into or reading from the memories may be lost, etc. In the worst case, the voltages applied to the respective semiconductor devices 1 and 2 may be outside the proper range of operating voltages, and the IC card may become inoperative.

The object of the present invention is to provide an IC card which is free of the above-stated problem and in which the voltage drop across a diode of a power supply switching circuit is kept small so that the IC card can always operate properly.

SUMMARY OF THE INVENTION

According to the present invention, an internal load of an IC card is divided into a plurality of load circuits in which currents substantially equal to each other flow. A power supply line is provided for each of the load circuits, and a power supply switching circuit is provided in each of the power supply lines. Thus, substantially equal load currents flow through the respective power supply switching circuits.

With this arrangement, the operating current or load currents flowing through the respective power supply switching circuits are substantially equal, whereby they can be set such that a voltage drop in each of the power supply switching circuits is minimized to produce no adverse affect on the characteristics of an associated load circuit.

BRIEF DESCRIPTION OF THE DRAWINGS

In the drawings, the same reference numerals denote similar components or functions.

DESCRIPTION OF THE PREFERRED EMBODIMENTS

Now, IC cards according to some embodiments of the present invention are described in detail.

Figure 3:
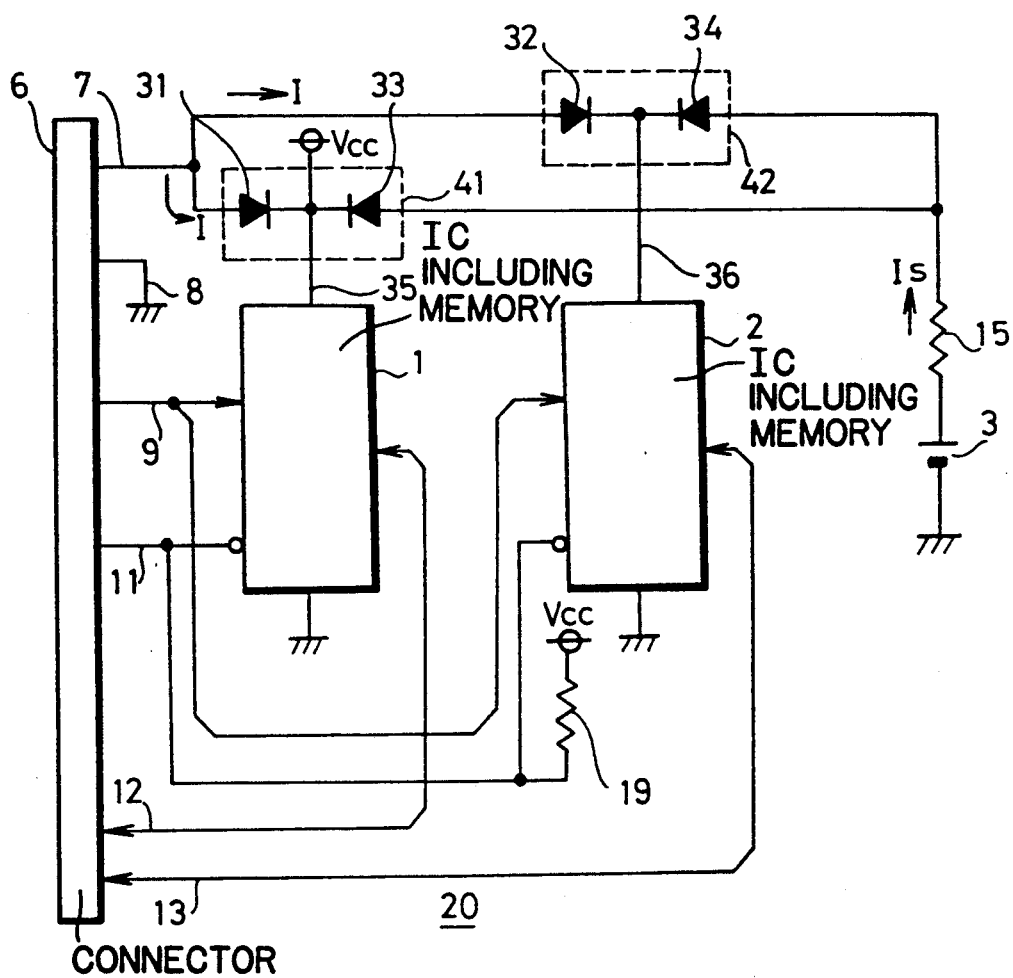
FIG. 3 schematically shows the internal structure of an IC card according to one embodiment of the present invention.

FIG. 3 shows an IC card according to one embodiment of the present invention, in which substantially equal operating currents flow in respective semiconductor devices 1 and 2, such as IC's including memories, microcomputers etc. The semiconductor device 1 is connected via a power supply line 35 to a first power supply switching circuit 41, and the second semiconductor device 2 is connected via a power supply line 36 to a second power supply switching circuit 42. An external-power-supply line 7 connected to a connector 6 is connected to the anode of a diode 31 which acts as a first switching element of the first power supply switching circuit 41 and to the anode of a diode 32 which acts as a first switching elements of the second power supply switching circuit 42. An internal power supply 3 is connected via a resistor 15 to the anode of a diode 33 which acts as a second switching element of the first power supply switching circuit 41 and also to the anode of a diode 34 which acts as a second switching element of the second power supply switching circuit 42. The cathodes of the diodes 31 and 33 of the first power supply switching circuit 41 are connected via the power supply line 35 to the semiconductor device 1, and the cathodes of the diodes 32 and 34 of the second power supply switching circuit 42 are connected via the power supply line 36 to the semiconductor device 2, as stated before. One end of a pull-up resistor 19 for a control line 11 is connected to the mutually connected cathodes of the diodes 31 and 33 of the power supply switching circuit 41, for example, and receives a voltage $V_{cc}$. The remaining portions of the circuit arrangement of FIG. 3 are similar to the circuit arrangement of the conventional IC card shown in FIG. 1.

When the connector 6 is not connected to an external device and, therefore, the CI card 20 operates in a standby mode from the internal power supply 3 of, for example, 3 V, an operating voltage (standby voltage) is applied to the semiconductor device 1 from the internal power supply 3 through the diode 33 of the frist power supply switching circuit 41 and the power supply line 35. The operating voltage for the semiconductor device 2 is supplied from the internal power supply 3 through the diode 34 of the second power supply switching circuit 42 and the power supply line 36. Thus the semiconductor devices operate in a standby mode.

Figure 2:
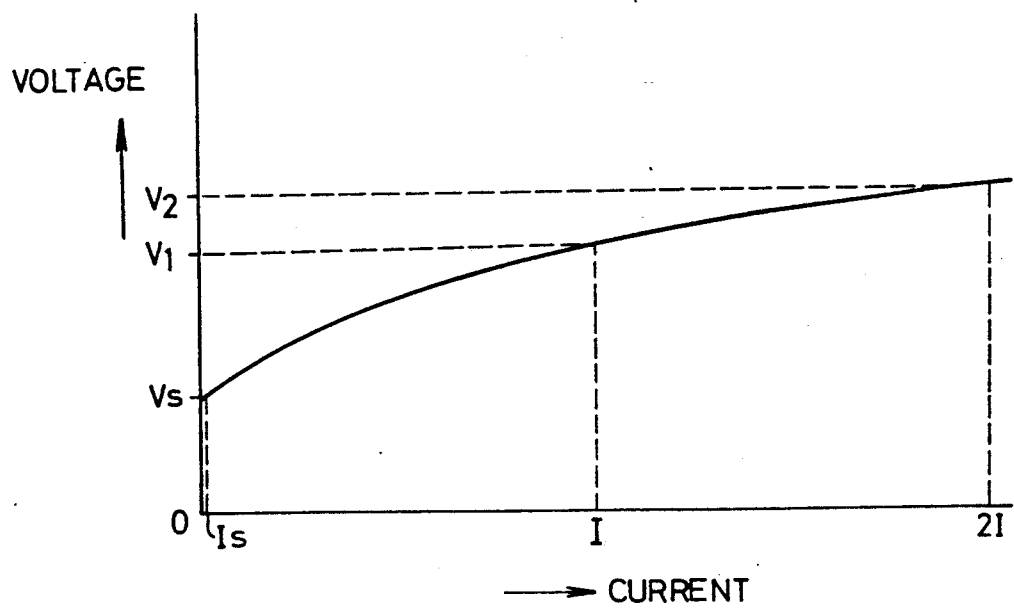
FIG. 2 is a voltage (V) versus current (I) characteristic of a switching diode used in a power supply switching circuit of an IC card.

When the IC card 20 is inserted into an external device, an operating voltage of, for example, 5 V is supplied from an external power supply through the connector 6 to the external-power-supply line 7, whereby the diodes 31 and 32 of the respective power supply switching circuits are turned on and the diodes 33 and 34 are turned off. Thus, the semiconductor devices 1 and 2 receive their operating voltages from the external power supply. In this case, a voltage drop across each of the diodes 31 and 32 of the respective power supply switching circuits 41 and 42 is developed by operating current (load current) I for one semiconductor device. Such a voltage drop is indicated by $V_1$ in FIG. 2, which may be 0.4–0.5 V, for example. Accordingly, an operating voltage of magnitude sufficient for proper operation of the semiconductor devices is applied to each of the semiconductor devices. Thus, there is no fear of degradation of operating characteristics of the IC card, such as longer time for accessing the memories in the semiconductor devices, improper writing and reading timing, etc.

Figure 1:
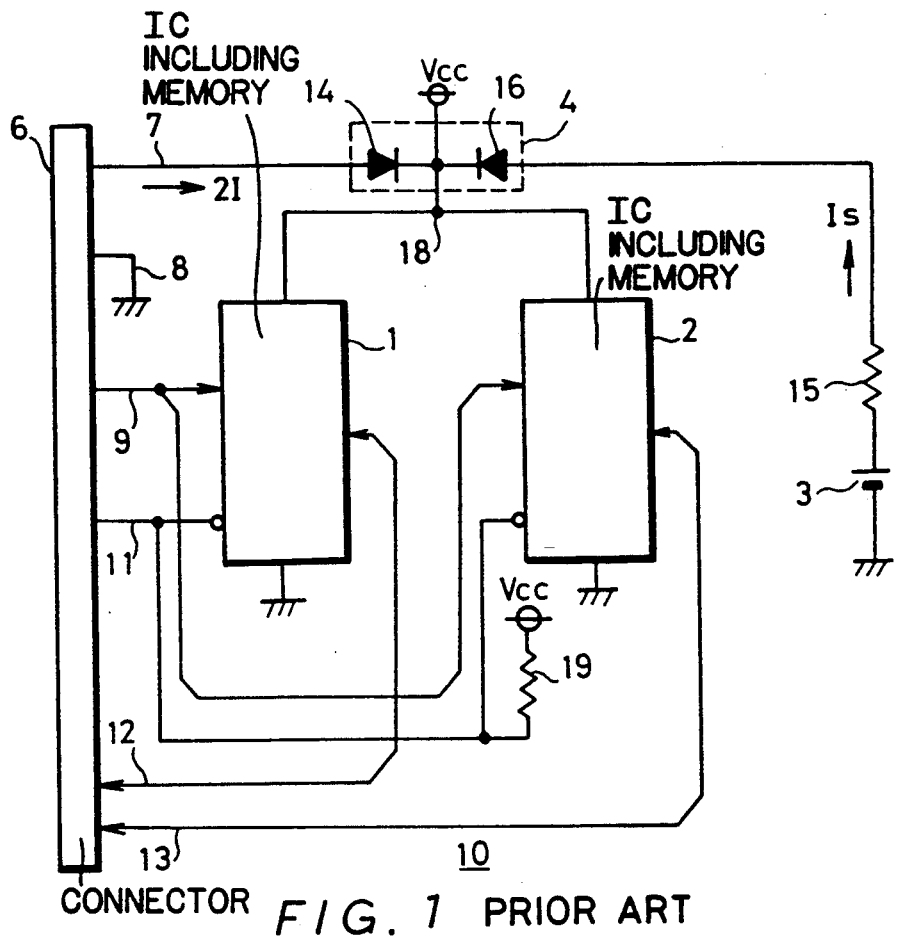
FIG. 1 schematically shows an example of internal structure of conventional IC cards.

It might be contemplated to use, as the diode 14 of the conventional IC card shown in FIG. 1, a diode having a larger junction area such that the voltage drop produced across it by the operating currents flowing into the two semiconductor devices 1 and 2 is $V_1$. A large junction area diode, however, is thick, and, therefore, it is far more difficult to mount such a large junction area diode in an IC card, which must be very thin, than to mount a number of smaller junction area diodes. In addition, the use of a large junction area diode such as diode 14 results in an increase in the number of the types of components, which is undesirable in view of component management.

Further, in the arrangement of FIG. 3, it could be contemplated to use diodes of different junction areas in the power supply switching circuits. But when the power supply switching circuits are to be formed in integrated circuit form, the use of such different junction area diodes is permitted only when load is unevenly distributed, and, therefore, the degree of freedom in designing is restricted accordingly, and, in addition, designing such an arrangement is difficult.

Thus, it is better to divide the internal load into plural load circuits such that substantially equal currents flow through the respective load circuits and to provide power supply switching circuits using diodes of the same size for the respective load circuits.

Figure 4:
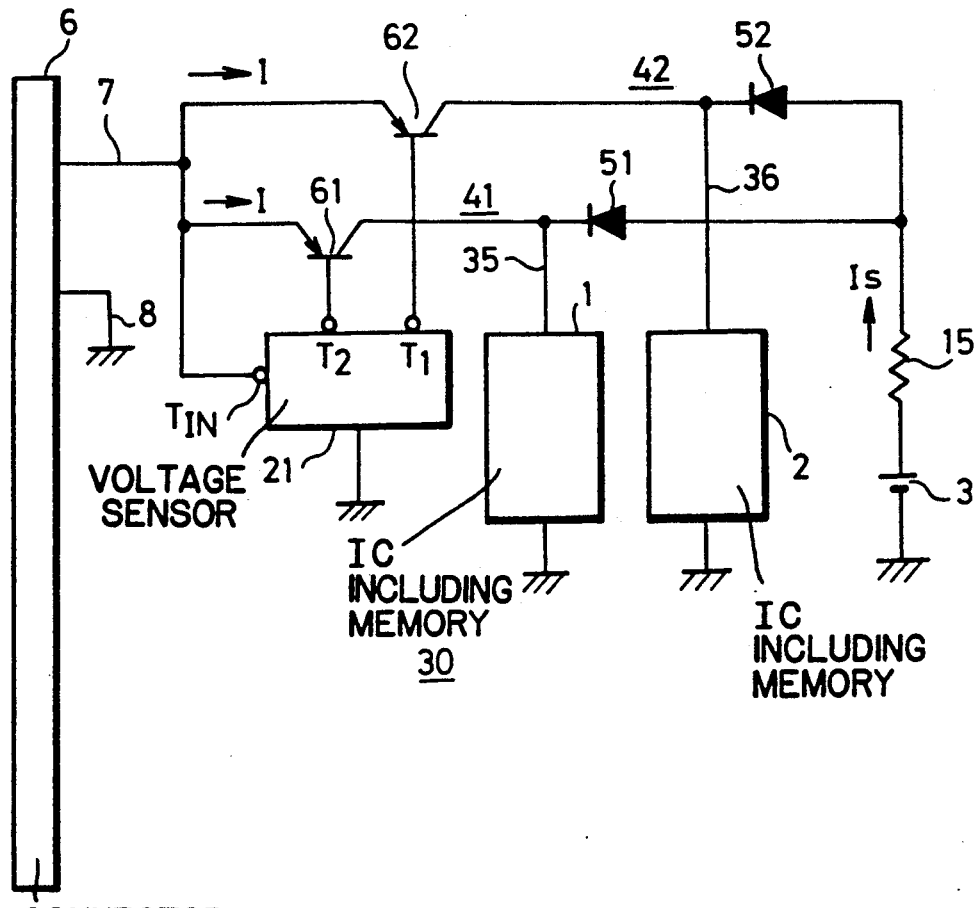
FIG. 4 schematically shows the structure of part of an IC card according to another embodiment of the present invention.

FIG. 4 shows part of an IC card according to another embodiment of the present invention. in this IC card 30, a diode 51 and a transistor 61 form a first power supply switching circuit 41 through which operating voltage is coupled to a first semiconductor device 1. A diode 52 and a transistor 62 form a second power supply switching circuit 42 which couples an operating voltage to a second semiconductor device 2. When the IC card 30 is operated from an internal power supply 3 of, for example, 3 V, operating voltages are applied to the semiconductor devices from the power supply 3 through the respective diodes 51 and 52. When the card 30 is inserted into an external device, an external voltage of, for example, 5 V is coupled to an external-power-supply line 7 from an external power supply. Then, a voltage sensing circuit 21 generates at its control terminals $T_1$ and $T_2$ a voltage which is lower than the voltage, 5 V, at its input terminal $T_{IN}$. Any suitable voltage sensing circuit may be used. For example, it may comprise a resistor which is connected between the input terminal $T_{IN}$ and ground and has an intermediate tap connected to the control terminals $T_1$ and $T_2$. The lower voltage at the control terminals $T_1$ and $T_2$ causes the transistors 61 and 62 to turn on. The turning-on of the transistors 61 and 62 causes the diodes 51 and 52 to be reverse biased into a non-conducting state so that an external operating voltage of about 5 V is applied to the semiconductor devices 1 and 2 through the conducting transistors 61 and 62, respectively. In this second embodiment, too, the voltage drops across the transistors 61 and 62 are small so that the respective semiconductor devices 1 and 2 can properly operate with no degradation of operation characteristics, such as delay in access to the memories, improper timing in writing into or reading and from the memories, etc.

In place of the illustrated bipolar transistors 61 and 62, other transistors, for example, FET's may be used.

The number of the semiconductor devices, i.e. the number of load circuits into which the internal load of an IC card is to be divided, is not restricted to two, but, depending on the setting of the magnitude of the load currents, any number, i.e., three or more, load circuits can be used.

As discussed in the above, according to the present invention, the overall internal load of an IC card is divided into a plurality of load circuits through which substantially equal currents flow, and a power supply switching circuit is provided for each of the load circuits. Thus, when operating power is supplied from an external power supply, the voltage drops in the power supply switching circuits can be minimized so that internal circuits containing memories, microcomputers etc. of the IC card can always operate in their optimum conditions.

What is claimed is:

1. An IC card comprising:
   a plurality of load circuits, each load circuit including a memory and having a substantially equal operational current flow therethrough;
   an internal power supply for providing data retention voltages to said memories of said load circuits;
   a connector for connecting the IC card to an external power supply and to an external device; and
   a plurality of power supply switching circuits, each power supply switching circuit being connected between said connector, said internal power supply, and a respective load circuit for connecting the respective load circuit to the external power supply when said IC card is connected to the external power supply for the connecting the respective load circuit to said internal power supply when said IC card is not connected to the external power supply.

2. An IC card according to claim 1 wherein each of said power supply switching circuits comprises a pair of diodes having first and second opposite polarity electrodes, each diode in each pair having a first electrode connected to an associated load circuit, the second electrode of one of said diodes of the pair being connected to said connector, the second electrode of the other of said diodes of the pair being connected to said internal power supply.

3. An IC card according to claim 2 wherein said first electrodes of said diodes are cathodes, and said second electrodes are anodes.

4. An IC card according to claim 1 wherein each of said power supply switching circuits comprises a transistor.

5. An IC card according to claim 1 wherein said power supply switching circuits comprise diodes connected between said internal power supply and the respective load circuits, transistors connected between said connector and the respective load circuits, and a voltage sensing circuit for sensing an external supply voltage supplied from the external power supply through said connector for switching said transistors in response to the external supply voltage.

* * * * *

UNITED STATES PATENT AND TRADEMARK OFFICE
CERTIFICATE OF CORRECTION

PATENT NO. : 5,138,142
DATED : August 11, 1992
INVENTOR(S) : Yoshikado Sanemitsu It is certified that error appears in the above-identified patent and that said Letters Patent is hereby corrected as shown below:

Claim 1, column 6, line 2, after "supply" insert --and--;

Claim 1, column 6, line 2, delete "the" (first occurrence).

Signed and Sealed this

Fourteenth Day of September, 1993

Attest:

BRUCE LEHMAN

Attesting Officer

Commissioner of Patents and Trademarks